(12) United States Patent
Kim et al.

(10) Patent No.: US 7,548,143 B2
(45) Date of Patent: Jun. 16, 2009

(54) MICROWAVE MODULE HAVING CONVERTER FOR IMPROVING TRANSMISSION CHARACTERISTICS

(75) Inventors: Dong Young Kim, Daejeon (KR); Jae Kyoung Mun, Daejeon (KR); Dong Suk Jun, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 11 days.

(21) Appl. No.: 11/875,604

(22) Filed: Oct. 19, 2007

(65) Prior Publication Data

US 2008/0136552 A1    Jun. 12, 2008

(30) Foreign Application Priority Data

Dec. 6, 2006     (KR)     ............... 10-2006-0123199
Mar. 14, 2007    (KR)     ............... 10-2007-0025080

(51) Int. Cl.
*H01P 3/08* (2006.01)
*H03H 7/38* (2006.01)

(52) U.S. Cl. ........................ 333/260; 333/33
(58) Field of Classification Search ............ 333/32, 333/33, 34, 254, 260, 238, 246, 247
See application file for complete search history.

(56) References Cited

U.S. PATENT DOCUMENTS

| 6,201,454 B1 | 3/2001 | Kinayman et al. |
| 2003/0030506 A1 * | 2/2003 | Dawn et al. ............... 333/34 |
| 2004/0014428 A1 | 1/2004 | Franca-Neto |
| 2006/0092093 A1 | 5/2006 | Choi et al. |
| 2006/0256018 A1 | 11/2006 | Soler Castany et al. |

FOREIGN PATENT DOCUMENTS

| JP | 2000-151218 | 5/2000 |
| JP | 2004-048736 | 2/2004 |
| KR | 1999-0051627 | 7/1999 |
| KR | 20000020274 | 4/2000 |
| KR | 20010044416 | 6/2001 |
| KR | 10-2001-0107436 | 12/2001 |

OTHER PUBLICATIONS

Tobias Krems, et al., "Coplanar Bond Wire Interconnections for Millimeter Wave Applications", Electrical Performance of Electronic Packaging, 1995, Oct. 2-4, 1995 pp. 178-180.
Shin Chaki, et al., "Study on Slit Pad Structure to Maintain MMIC Characteristics Both in On-Wafer and Package Conditions in Millimeter-Wave Applications", Microwave Conference, 2005 European, vol. 1, Oct. 4-6, 2005, 4 pp.
Kim et al., (Investigation of Ultralow Loss Interconnection Technique) symposium held Nov. 27-Dec. 1, 2006, Boston, Massachusetts, U.S.A.

* cited by examiner

*Primary Examiner*—Stephen E Jones
(74) *Attorney, Agent, or Firm*—Rabin & Berdo, P.C.

(57) ABSTRACT

Provided is a microwave module having a converter for improving transmission characteristics in a millimeter-wave band. When a microstrip transmission line and a conductor-backed coplanar waveguide (CBCPW) transmission line are connected by wire bonding, a change in impedance caused by wire bonding and an abrupt change in electric field components between the two transmission lines are reduced by the converter. Therefore, insertion loss and return loss are reduced, and transmission characteristics in a millimeter-wave band are improved.

9 Claims, 7 Drawing Sheets

MICROWAVE MODULE HAVING CONVERTER FOR IMPROVING TRANSMISSION CHARACTERISTICS

CROSS-REFERENCE TO RELATED APPLICATION

This application claims priority to and the benefit of Korean Patent Application No. 2006-123199, filed Dec. 6, 2006, and No. 2007-25080, filed Mar. 14, 2007, the disclosure of which is incorporated herein by reference in its entirety.

BACKGROUND

1. Field of the Invention

The present invention relates to a microwave module having a converter for improving transmission characteristics in a millimeter-wave band, and more particularly, to a microwave module having a converter capable of, when a microstrip transmission line and a conductor-backed coplanar waveguide (CBCPW) transmission line are connected by wire bonding, reducing a change in impedance caused by bonding wires and an abrupt change in electric field components between the two transmission lines to thereby improve transmission characteristics in a millimeter-wave band.

This work was supported by the IT R&D program of Ministry of Information and Communication/Institute for Information Technology Advancement [2005-S-039-02, SoP (System on Pakage) for 60 GHz Pico cell Communication.]

2. Discussion of Related Art

Frequencies in the millimeter-wave band, which are radio frequency resources above 30 GHz, are being actively examined as frequency resources for the next generation information communication service. The frequencies in the frequency band can transmit a large amount of information at high speed using a wide-band characteristic. In addition, since the frequencies are highly attenuated in air, the same frequency band can be used in adjacent areas without interference. Therefore, the frequencies have been a matter of concern for many researchers. Currently, development of an information communication service and system using a millimeter-wave frequency is underway, together with research and development of varieties of device parts required for the above-mentioned information communication service and system. Also, research on implementation of a system in the form of a system on package (SOP) using a packaging method of the millimeter-wave band is vigorously progressing.

As the most suitable technology for an SOP method, low temperature cofired ceramics (LTCC) or liquid crystal polymer (LCP) technology is considered. When an active device, such as an amplifier, etc., is installed on a package substrate using such LTCC or LCP technology, flip-chip bonding and wire-bonding are used as a method of interconnecting a transmission line with an active device on the substrate.

The flip-chip bonding demands a very short interconnection and thus can reduce the influence of inductance due to bonding. In addition, when there are a large number of bondings, the flip-chip bonding facilitates bonding operations. However, in the millimeter-wave band, particularly in an extremely high frequency (EHF) band above 60 GHz, transmission loss abruptly increases.

The wire-bonding forms a simple structure and does not need complex equipment, and thus is widely used. However, since the influence of inductance increases with frequency increase, matching is difficult. In addition, insertion loss and return loss increase at a high frequency as in the millimeter-wave band.

SUMMARY OF THE INVENTION

The present invention is directed to reducing insertion loss and return loss caused by wire bonding between a microstrip transmission line and a conductor-backed coplanar waveguide (CBCPW) transmission line when a stacked-system on package (SOP)-type microwave module operating in a millimeter-wave frequency band, particularly in an extremely high frequency (EHF) band above 60 GHz, is fabricated using low temperature cofired ceramics (LTCC) or liquid crystal polymer (LCP) technology, and thereby improves transmission characteristics in the millimeter-wave frequency band.

One aspect of the present invention provides a microwave module comprising a converter disposed between a microstrip transmission line and a conductor-backed coplanar waveguide (CBCPW) transmission line to reduce a change in impedance caused by bonding wires and an abrupt change in electric field components between the two transmission lines when the microstrip transmission line and the CBCPW transmission line are connected through the bonding wires.

BRIEF DESCRIPTION OF THE DRAWINGS

The above and other objects, features and advantages of the present invention will become more apparent to those of ordinary skill in the art by describing in detail preferred embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Figure 1:
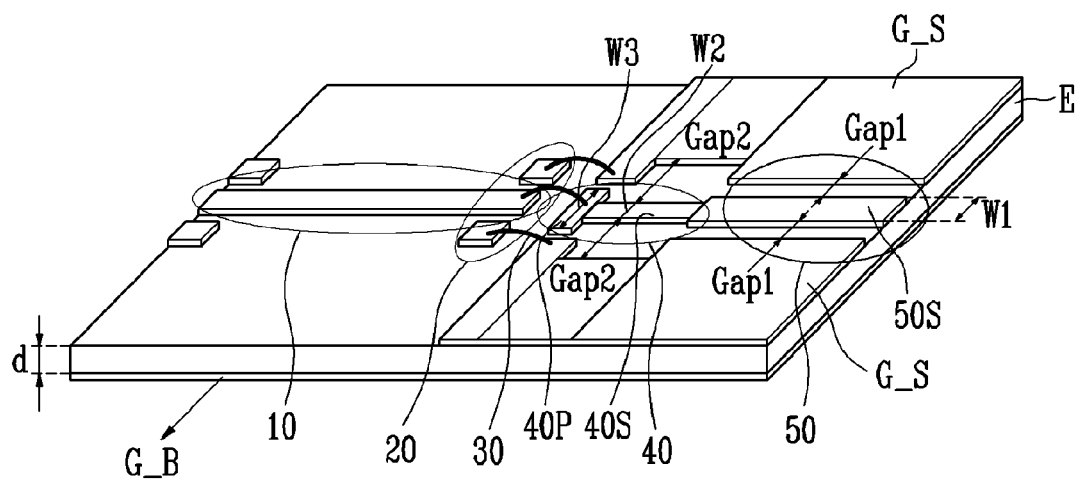
FIG. 1 is a perspective view of a microwave module having a converter for improving transmission characteristics in a millimeter-wave band according to an exemplary embodiment of the present invention.

FIG. 1 is a perspective view of a microwave module having a converter for improving transmission characteristics in a millimeter-wave band according to an exemplary embodiment of the present invention.

As illustrated in FIG. 1, in the microwave module of the present invention, a 50-ohm microstrip transmission line 10, which is an active element, and a 50-ohm conductor-backed coplanar waveguide (CBCPW) transmission line 50 are connected through bonding wires 30, and a converter 40 for reducing insertion loss and return loss due to the bonding wires 30 is connected between the microstrip transmission line 10 and the CBCPW transmission line 50.

In a millimeter-wave band above 60 GHz, insertion loss and return loss are reduced by the converter 40, which will be described in detail below.

Figure 2A:
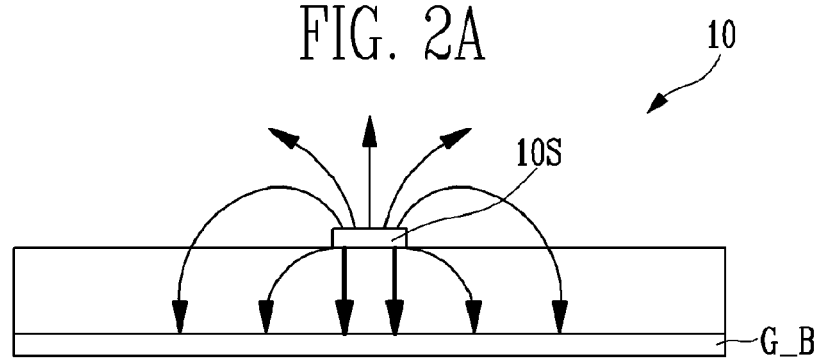
FIG. 2A illustrates electric field distribution of a microstrip transmission line in a quasi-transverse electromagnetic (TEM) mode.
Figure 2B:
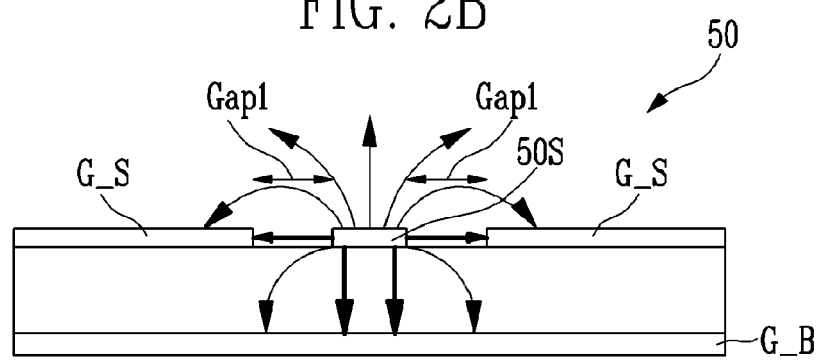
FIG. 2B illustrates electric field distribution of a conductor-backed coplanar waveguide (CBCPW) transmission line in the quasi-TEM mode.

FIG. 2A illustrates electric field distribution of a microstrip transmission line in a quasi-transverse electromagnetic (TEM) mode, and FIG. 2B illustrates electric field distribution of a CBCPW transmission line in the quasi-TEM mode.

As illustrated in FIG. 2A, the microstrip transmission line 10 comprises a ground G_B under a dielectric E, and a signal line 10S on the dielectric E. It can be seen that electric field components of the microstrip transmission line 10 in the quasi-TEM mode are strongest between the signal line 10S and the ground G_B.

On the other hand, as illustrated in FIG. 2B, the CBCPW transmission line 50 comprises grounds G_S at both sides of a signal line 50S as well as the ground G_B under the dielectric E. Therefore, it can be seen that electric field components of the CBCPW transmission line 50 at both sides of the signal line 50S in the quasi-TEM mode are much stronger than those of the microstrip transmission line 10 of FIG. 2A.

In other words, when the microstrip transmission line 10 and the CBCPW transmission line 50 having different characteristics are connected through the bonding wires 30 as described above, insertion loss and return loss increase due to a change in impedance caused by the inductance of the bonding wires 30 and discontinuous change in electric field components.

Therefore, in the present invention, when the microstrip transmission line 10 and the CBCPW transmission line 50 are connected through the bonding wires 30, the converter 40 reduces a change in impedance caused by wire bonding and an abrupt change in electric field components between the two transmission lines 10 and 50, thereby reducing insertion loss and return loss. Such transmission characteristic improvement by the converter 40 will be described in detail below.

Referring back to FIG. 2B, when distances Gap1 between the signal line 50S and the side grounds G_S increase in the CBCPW transmission line 50, the magnitude of the electric field components from the signal line 50S to the side grounds G_S decreases. When the distances Gap1 further increase, distribution of the electric field components of the CBCPW transmission line 50 becomes the same as that of the microstrip transmission line 10 shown in FIG. 2A.

In other words, the converter 40 of the present invention uses the above described principle that the characteristic impedance of a transmission line varies according to a distance between a signal line and a side ground. As illustrated in FIG. 1, a distance Gap2 between the signal line 40S of the converter 40 and the side grounds G_S is formed wider than the distance Gap1 between the signal line 50S and the side grounds G_S in the CBCPW transmission line 50 by a predetermined width, and a width W2 of the converter 40 is formed narrower than a width W1 of the CBCPW transmission line 50 by a predetermined width. Therefore, a change in impedance caused by the bonding wires 30 and an abrupt change in electric field components between the two transmission lines 10 and 50 can be lessened by the converter 40. Here, it is preferable for connection with the bonding wires 30 that a bonding pad 40P is added to the converter 40. The bonding pad 40P of the converter 40 will be described in detail below.

COMPARATIVE EXAMPLE 1

Figure 3A:
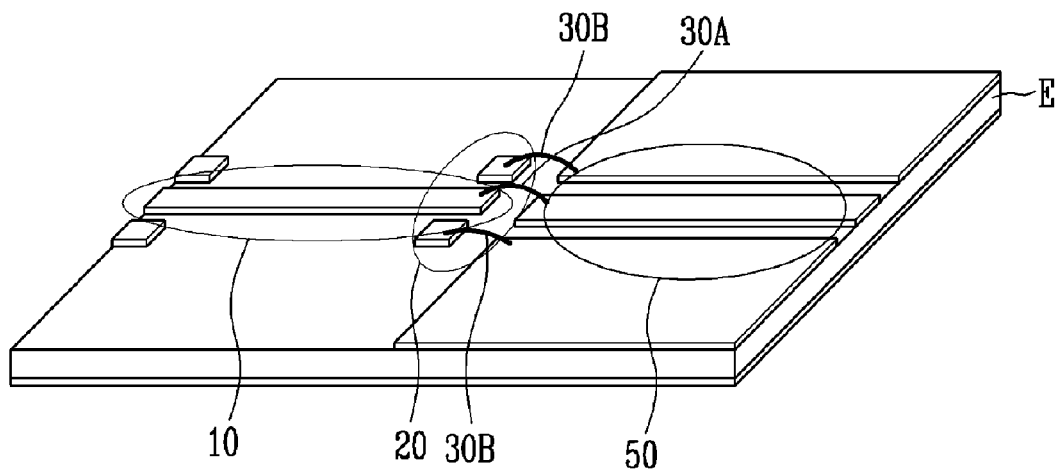
FIG. 3A is a perspective view of a microstrip transmission line and a CBCPW transmission line connected by general wire bonding.
Figure 3B:
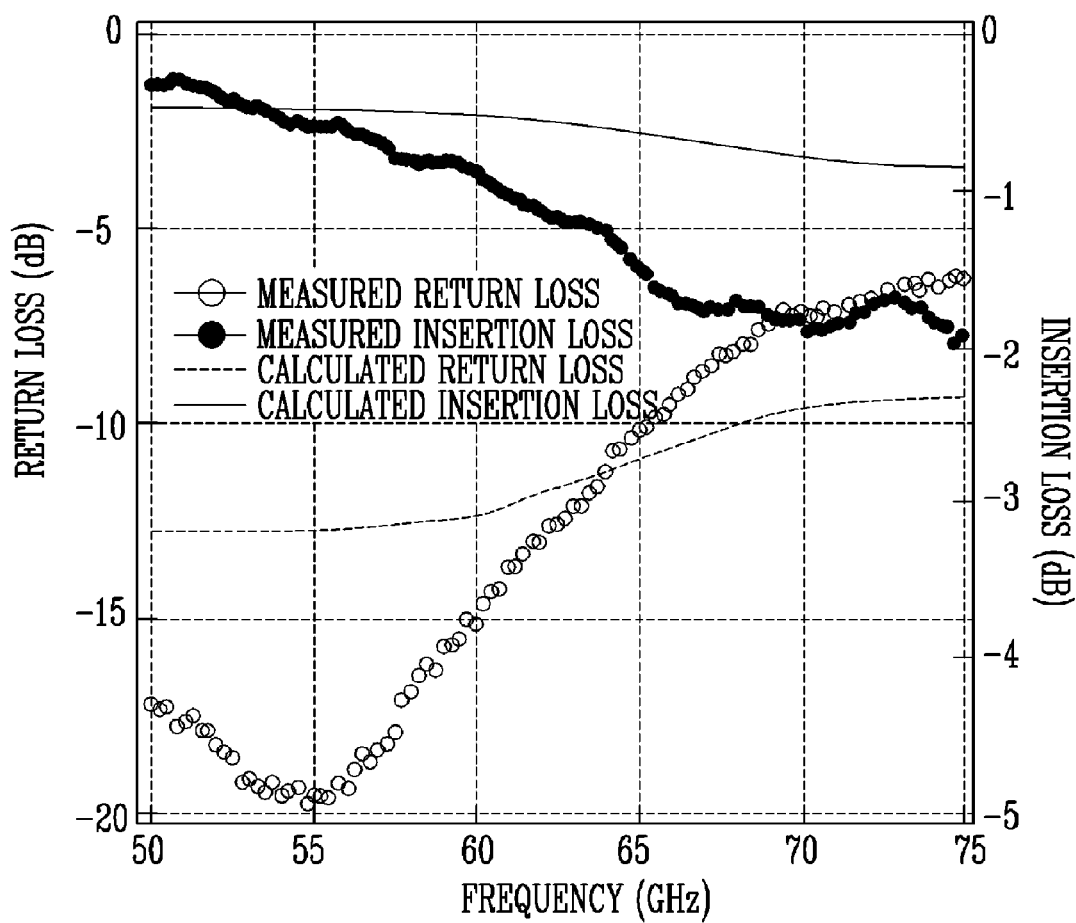
FIG. 3B is a graph showing the result obtained by measuring transmission and reflection characteristics of bonded lines of FIG. 3A using a network analyzer.

FIG. 3A is a perspective view of a microstrip transmission line 10 and a CBCPW transmission line 50 connected by general wire bonding, and FIG. 3B is a graph showing the result obtained by measuring transmission and reflection characteristics of bonded lines of FIG. 3A using a network analyzer. In the measurement, a dielectric substrate having a permittivity of 5.8 and a thickness of 100 μm, the 50-ohm microstrip transmission line 10, and the 50-ohm CBCPW transmission line 50 were used.

As illustrated in FIG. 3A, the microstrip transmission line 10 and the CBCPW transmission line 50 are connected through one ribbon 30A having a width of 50 μm and a thickness of 13 μm, and two wires 30B having a diameter of 20 μm. In this case, according to transmission characteristics in a millimeter-wave band, insertion loss and return loss are caused by a change in impedance due to the ribbon 30A and the bonding wires 30B and difference in electric field distribution between the two transmission lines 10 and 50, as illustrated in FIG. 3B. Therefore, it can be seen that transmission loss increases.

For example, in FIG. 3B, insertion loss is about −0.5 dB and return loss is about −12.3 dB, at 60 GHz. However, according to an actual measurement result, insertion loss was about −0.9 dB, return loss was about −15.1 dB, and transmission loss further increased with the increase in frequency.

Here, as the lengths of the ribbon 30A and the bonding wires 30B decrease, transmission loss is reduced in general. However, in consideration of process error according to characteristics of a low temperature cofired ceramics (LTCC) or liquid crystal polymer (LCP) process, a distance between the two transmission lines 10 and 50 must be maintained at a minimum of about 200 µm. Therefore, the lengths of the ribbon 30A and the bonding wires 30B were 200 µm. In addition, since transmission characteristics in a case where one ribbon is used are almost the same as those in a case where two ribbons are used, the latter case is not shown in the drawings.

COMPARATIVE EXAMPLE 2

Figure 4A:
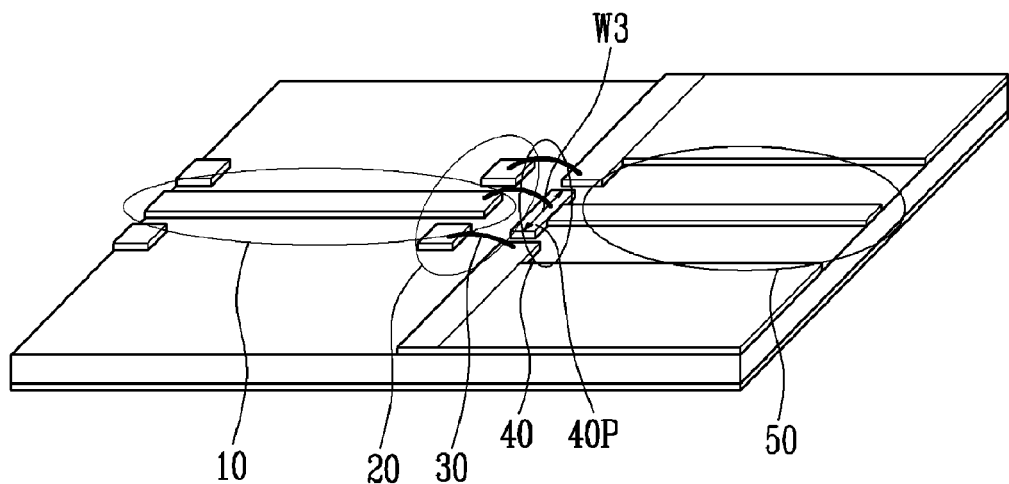
FIG. 4A is a perspective view of a microstrip transmission line and a CBCPW transmission line connected through bonding wires, in which a converter consisting of a bonding pad alone is employed and the width of the bonding pad is changed.

FIG. 4A is a perspective view of a microstrip transmission line 10 and a CBCPW transmission line 50 connected through bonding wires 30 in which a converter 40 consisting of a bonding pad 40P alone is employed, and a width W3 of the bonding pad 40P is increased. And, FIG. 4B is a graph showing an experimental result of transmission characteristics obtained from the structure of FIG. 4A while the width W3 of the bonding pad 40P is changed by a multiple of the width of the CBCPW transmission line 50.

Figure 4B:
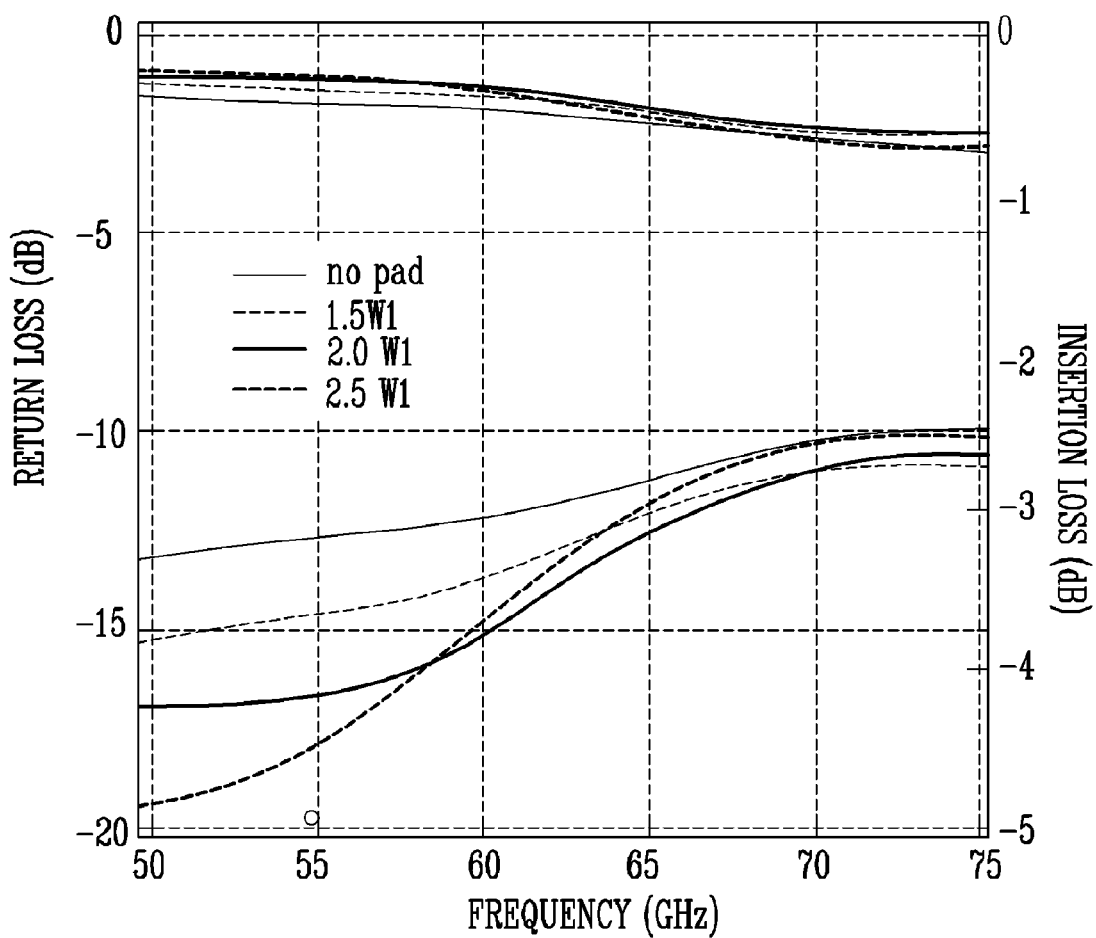
FIG. 4B is a graph showing an experimental result obtained from the structure of FIG. 4A while the width of the bonding pad is changed by a multiple of the width of the CBCPW transmission line.

As illustrated in FIG. 4A, when the width W3 of the bonding pad 40P increases, the capacitance components of the bonding pad 40P increase in number, and thus the insertion loss and return loss of the bonding wires 30 decrease slightly but not significantly, as shown in FIG. 4B. In particular, when the width W3 of the bonding pad 40P significantly increases, the insertion loss and return loss increase again. Consequently, it is preferable to have an appropriate width, e.g., about double a width W1 of the CBCPW transmission line 50.

More specifically, as can be seen from Comparative Examples 1 and 2, when the microstrip transmission line 10 is connected with the CBCPW transmission line 50 through the bonding wires 30, transmission loss increases due to a change in impedance caused by the inductance of the bonding wires 30. Here, when the number of capacitance components is increased by increasing the width W3 of the bonding pad 40P of the converter 40, transmission loss can be reduced slightly but not significantly. Rather, transmission loss increases when the width W3 of the bonding pad 40P increases beyond a specific value.

COMPARATIVE EXAMPLE 3

Figure 5A:
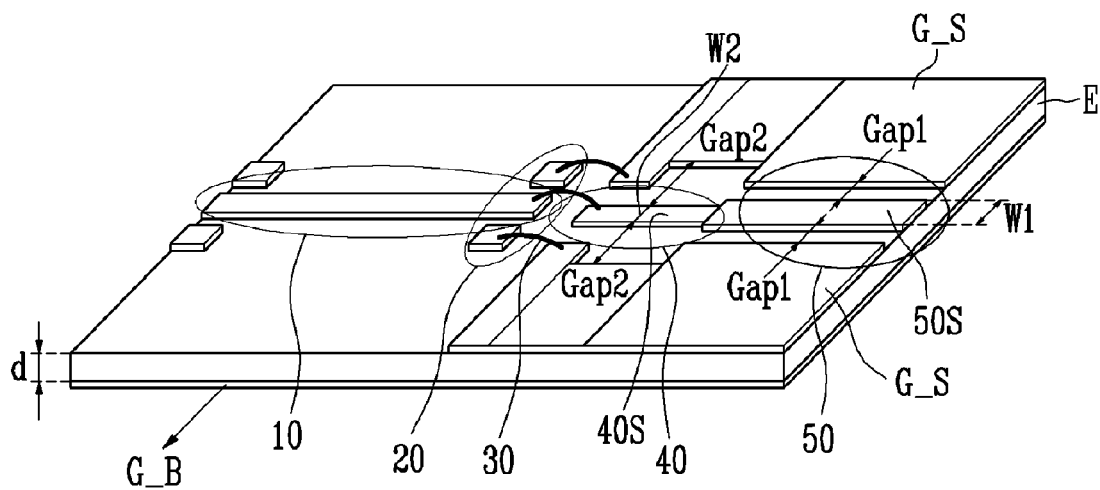
FIG. 5A is a perspective view of a microstrip transmission line and a CBCPW transmission line connected through bonding wires, in which a converter consisting of a signal line alone is employed and a distance between the signal line and side grounds is changed.
Figure 5B:
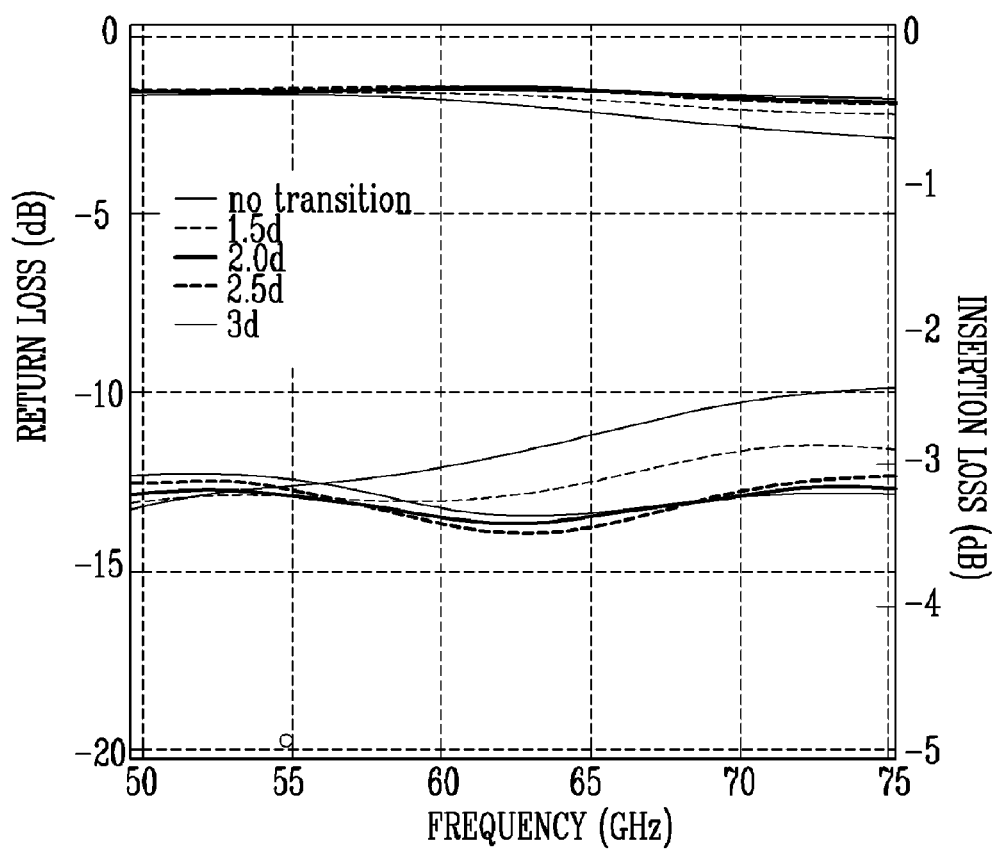
FIG. 5B is a graph showing a simulated result of transmission characteristics obtained from the structure of FIG. 5A while the distance between the signal line of the converter and the side grounds is changed by a multiple of the thickness of a dielectric substrate.

FIG. 5A is a perspective view of a microstrip transmission line 10 and a CBCPW transmission line 50 connected through bonding wires 30 in which a converter 40 consisting of a signal line 40S alone is employed, and a distance between the signal line 40S and side grounds G_S is changed. And, FIG. 5B is a graph showing a simulated result of transmission characteristics obtained from the structure of FIG. 5A while the distance between the signal line 40S of the converter 40 and the side grounds G_S is changed by a multiple of a thickness d of a dielectric substrate.

As illustrated in FIG. 5A, when the distance between the signal line 40S in the converter 40 and the side grounds G_S increases, transmission loss decreases, but not significantly. In particular, when the distance between the signal line 40S and the side grounds G_S is more than double the thickness d of the dielectric substrate, the transmission characteristics are almost unchanged.

Exemplary Embodiment

In this exemplary embodiment, a stacked-system on package (SOP)-type microwave module shown in FIG. 1, which has the converter 40 for reducing a change in impedance caused by wire bonding between the microstrip transmission line 10 and the CBCPW transmission line 50 and an abrupt change in electric field components between the two transmission lines 10 and 50, is described.

Here, it is assumed that a width W3 of the bonding pad 40P of the converter 40 equals 1.5 to 2.5 times the width W1 of the CBCPW transmission line 50, the width W2 of the signal line 40S in the converter 40 changes between 0.3 and 1.2 times the width W1 of the CBCPW transmission line 50, and the length of the converter 40 equals about ¼ of a center frequency wavelength. In addition, it is assumed that the distance between the signal line 40S in the converter 40 and the side grounds G_S changes between 1.5 and 3 times a thickness d of a dielectric substrate, and the microstrip transmission line 10 is connected with the CBCPW transmission line 50 through one ribbon having a line width of 50 µm and a thickness of 13 µm, or two wires having a diameter of 20 µm.

Figure 6:
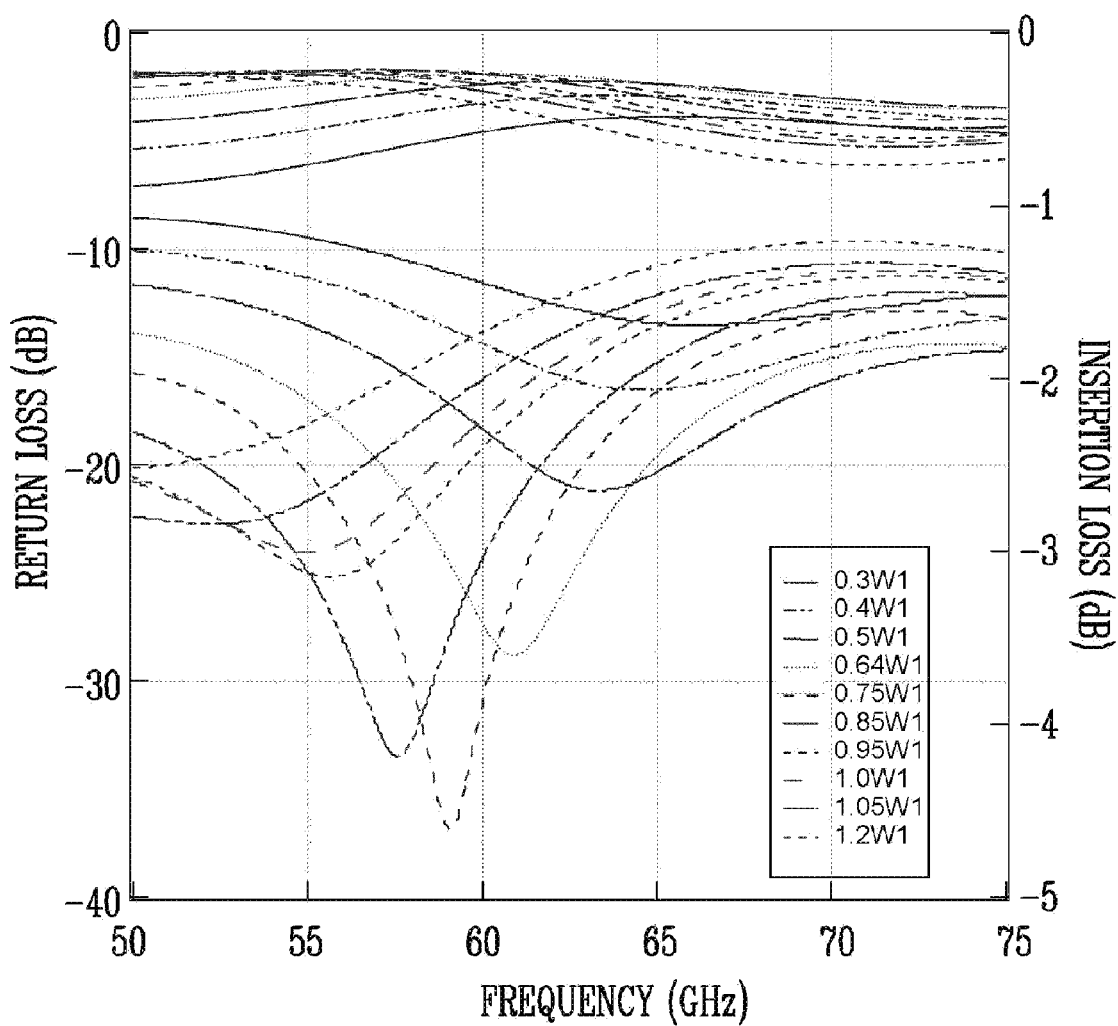
FIG. 6 is a graph showing an experimental result of transmission characteristics obtained from a stacked-system on package (SOP)-type microwave module employing a converter according to an exemplary embodiment of the present invention while the width of a signal line in the converter changes between 0.3 and 1.2 times the width of a CBCPW transmission line.
Figure 7:
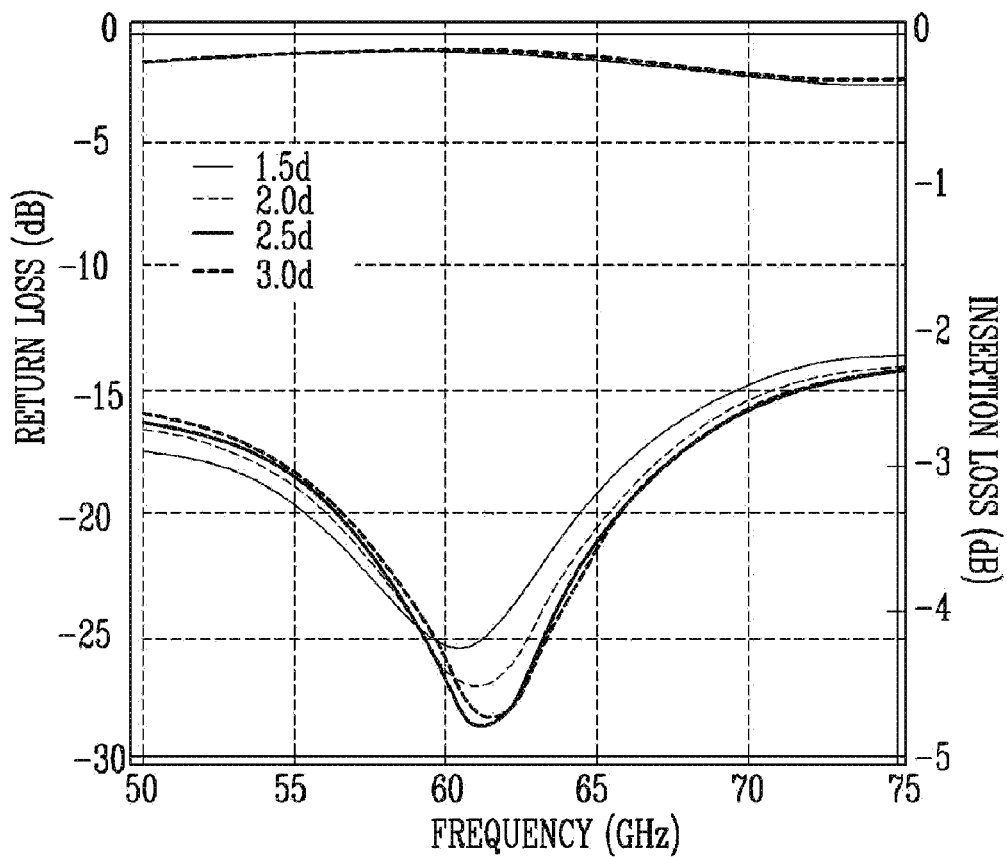
FIG. 7 is a graph showing an experimental result of transmission characteristics obtained from a stacked-SOP-type microwave module employing a converter according to an exemplary embodiment of the present invention while a distance between a signal line in the converter and side grounds is changed by a multiple of the thickness of a dielectric substrate.

FIG. 6 is a graph showing an experimental result of transmission characteristics obtained from the stacked-SOP-type microwave module employing the converter 40 according to the exemplary embodiment of the present invention while the width W2 of the signal line 40S in the converter 40 changes between 0.3 and 1.2 times the width W1 of the CBCPW transmission line 50. And, FIG. 7 is a graph showing an experimental result of transmission characteristics obtained while a distance between the signal line 40S in the converter 40 and the side grounds G_S is changed by a multiple of the thickness d of the dielectric substrate.

As illustrated in FIG. 6, when the width W2 of the signal line 40S in the converter 40 equals 0.5 to 0.85 times the width W1 of the CBCPW transmission line 50, it is possible to obtain excellent characteristics, i.e., insertion loss of about −0.5 dB or less and return loss of about −18 dB or less, at a 60 GHz band. In addition, as illustrated in FIG. 7, when a distance between the signal line 40S in the converter 40 and the side grounds G_S changes between 1.5 and 3 times the thickness d of the dielectric substrate, it is possible to obtain excellent characteristics, i.e., insertion loss of about −0.3 dB or less and return loss of about −20 dB or less, at a 60 GHz band. Here, it is preferable that the width of the bonding pad 40P of the converter 40 is double that of the CBCPW transmission line 50.

Figure 8:
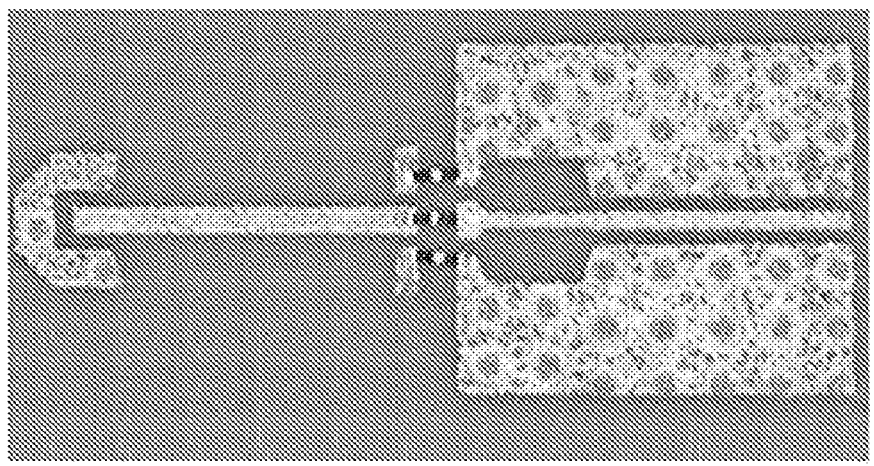
FIG. 8 illustrates an example of a stacked-SOP-type microwave module employing a converter according to an exemplary embodiment of the present invention, the stacked-SOP-type microwave module being fabricated to have the width of a bonding pad of the converter equal to double the width of a CBCPW transmission line, the width of a signal line of the converter equal to 0.5 times the width of the CBCPW transmission line, and a distance between the signal line in the converter and side grounds equal to 3 times the thickness of a dielectric substrate.

According to such an experiment result, an example of a stacked-SOP-type microwave module, fabricated to have the width W3 of the bonding pad 40P of the converter 40 equal to double the width W1 of the CBCPW transmission line 50, the width W2 of the signal line 40S of the converter 40 equal to 0.5 times the width W1 of the CBCPW transmission line 50, and a distance between the signal line 40S in the converter 40 and the side grounds G_S equal to 3 times the thickness d of the dielectric substrate, is illustrated in FIG. 8. And, a result obtained by analyzing transmission and reflection characteristics of the stacked-SOP-type microwave module of FIG. 8 using a network analyzer is illustrated in FIG. 9.

Figure 9:
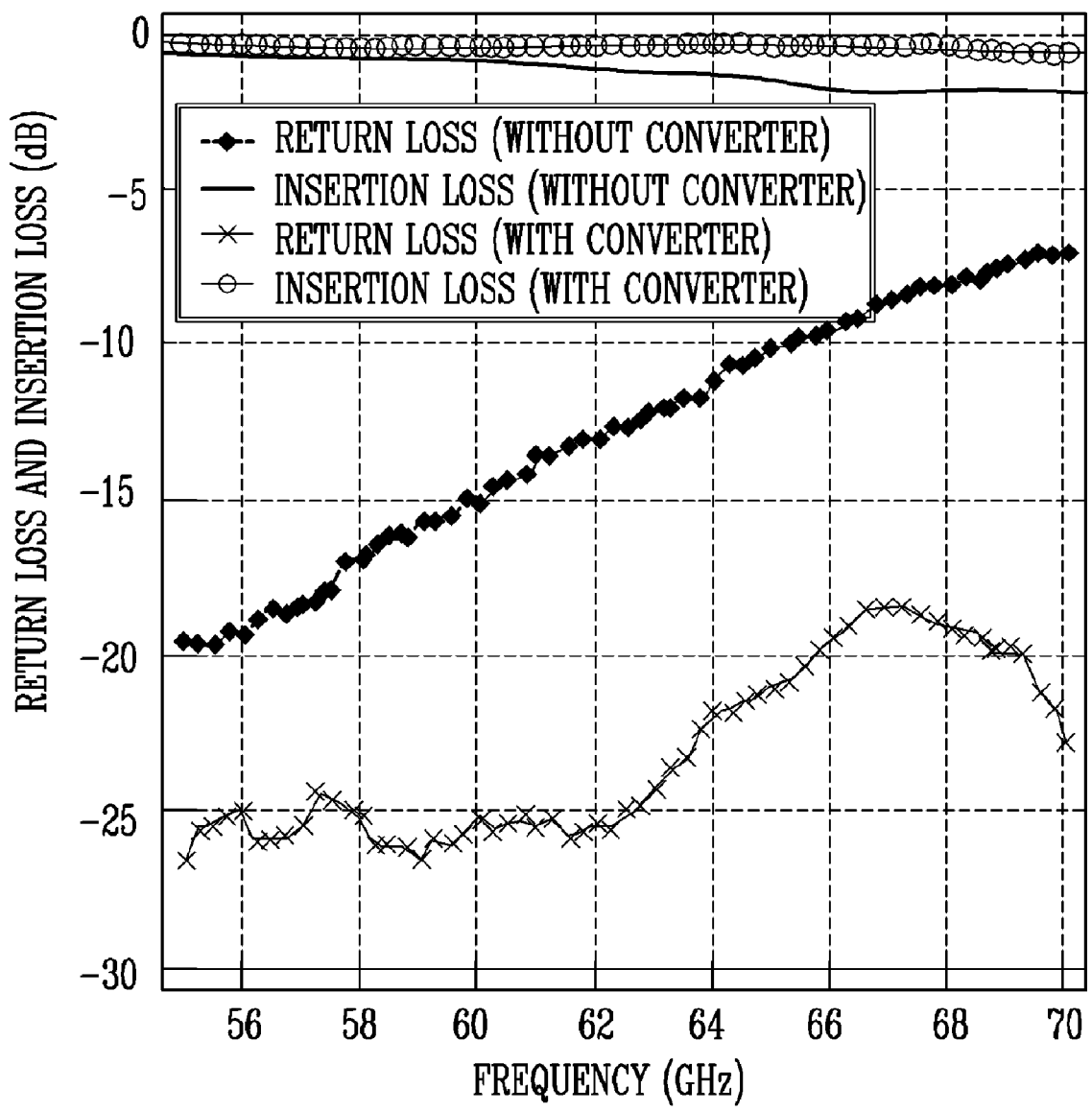
FIG. 9 is a graph showing a result obtained by analyzing transmission and reflection characteristics of the stacked-SOP-type microwave module of FIG. 8 using a network analyzer.

As illustrated in FIG. 9, the stacked-SOP-type microwave module having the converter 40 according to an exemplary embodiment of the present invention has a low return loss of −20 dB or below and a low insertion loss of about −0.3 dB to 65 GHz in consideration of a microwave module not having a converter.

More specifically, when the microstrip transmission line 10 and the CBCPW transmission line 50 are connected through the bonding wires 30 as described above, a change in impedance caused by the bonding wires and inequality of electric field components between the two transmission lines 10 and 50 are solved by the converter 40, so that the stacked-SOP-type microwave module having low loss in a millimeter-wave band can be implemented.

As described above, according to the present invention, when a microstrip transmission line and a CBCPW transmission line are connected by wire bonding in a microwave module, a change in impedance caused by bonding wires and inequality of electric field components between the two transmission lines are solved by a converter, so that transmission characteristics in a millimeter-wave band can be improved.

While the invention has been shown and described with reference to certain exemplary embodiments thereof, it will be understood by those skilled in the art that various changes in form and details may be made therein without departing from the spirit and scope of the invention as defined by the appended claims. In particular, a converter capable of operating at a 60 GHz band in the millimeter-wave band has been described as an example in the present invention, but a converter according to the present invention is not limited thereto. Needless to say, it is possible to reduce insertion loss and return loss caused by a bonding wire in other millimeter-wave frequency bands also.

What is claimed is:

1. A microwave module, comprising:
   a converter disposed between a microstrip transmission line and a conductor-backed coplanar waveguide (CB-CPW) transmission line to reduce a change in impedance caused by bonding wires and an abrupt change in electric field components between the two transmission lines when the microstrip transmission line and the CBCPW transmission line are connected through the bonding wires.

2. The microwave module of claim 1, wherein a length of the converter is ¼ of a center frequency wavelength.

3. The microwave module of claim 1, wherein the converter comprises:
   a bonding pad for connection with the bonding wires; and
   a signal line for signal transfer between the microstrip transmission line and the CBCPW transmission line.

4. The microwave module of claim 3, wherein a width of the bonding pad of the converter ranges from 1.5 times to 2.5 times a width of the CBCPW transmission line.

5. The microwave module of claim 3, wherein a width of the signal line of the converter ranges from 0.5 times to 0.85 times a width of the CBCPW transmission line.

6. The microwave module of claim 3, wherein a distance between the signal line of the converter and side grounds ranges from 1.5 times to 3 times a thickness of a dielectric substrate disposed under the microstrip transmission line and the CBCPW transmission line.

7. The microwave module of claim 4, wherein insertion loss and return loss caused by the bonding wires in a millimeter-wave frequency band change according to at least one of the width of the bonding pad of the converter, the width of the signal line of the converter, and the distance between the signal line of the converter and the side grounds.

8. The microwave module of claim 5, wherein insertion loss and return loss caused by the bonding wires in a millimeter-wave frequency band change according to at least one of the width of the bonding pad of the converter, the width of the signal line of the converter, and the distance between the signal line of the converter and the side grounds.

9. The microwave module of claim 6, wherein insertion loss and return loss caused by the bonding wires in a millimeter-wave frequency band change according to at least one of the width of the bonding pad of the converter, the width of the signal line of the converter, and the distance between the signal line of the converter and the side grounds.

* * * * *